United States Patent
Hong

(10) Patent No.: US 7,754,396 B2
(45) Date of Patent: Jul. 13, 2010

(54) MASK WITH FOCUS MEASUREMENT PATTERN AND METHOD FOR MEASURING FOCUS VALUE IN EXPOSURE PROCESS USING THE SAME

(75) Inventor: Jong Kyun Hong, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 537 days.

(21) Appl. No.: 11/758,502

(22) Filed: Jun. 5, 2007

(65) Prior Publication Data

US 2008/0160425 A1 Jul. 3, 2008

(30) Foreign Application Priority Data

Dec. 28, 2006  (KR) .................... 10-2006-0137140

(51) Int. Cl.
*G03F 1/00* (2006.01)
(52) U.S. Cl. ........................................... 430/5
(58) Field of Classification Search .............. 430/5, 430/22, 30
See application file for complete search history.

(56) References Cited

U.S. PATENT DOCUMENTS 6,440,616 B1    8/2002  Choi .............................. 430/5
6,706,452 B2 *  3/2004  Hayano et al. .................. 430/5
6,897,956 B2    5/2005  Noguchi et al.
6,974,653 B2   12/2005  Leung et al.
7,180,189 B2 *  2/2007  Bowes ........................ 257/757
2004/0241558 A1* 12/2004 Garcia et al. .................... 430/5
2007/0035659 A1  2/2007  Izuha et al. .................. 348/441

FOREIGN PATENT DOCUMENTS

JP    2000 171683    6/2000
JP    2001-189264    7/2001
KR    10-2005-0073321   7/2005

* cited by examiner

*Primary Examiner*—Stephen Rosasco
(74) *Attorney, Agent, or Firm*—Marshall, Gerstein & Borun LLP

(57) ABSTRACT

A mask with a focus measurement pattern and a method for measuring a focus value in an exposure process using the same that are capable of improving the measurement of a focus change, wherein the mask includes an outer reference pattern which provides a position reference for focus measurement, and focus measurement patterns which are provided apart from the outer reference pattern and formed in a line shape extending in two different directions. Accordingly, the focus change caused in the exposure process can be measured by measuring the line shortening of the focus measurement patterns.

10 Claims, 4 Drawing Sheets

MASK WITH FOCUS MEASUREMENT PATTERN AND METHOD FOR MEASURING FOCUS VALUE IN EXPOSURE PROCESS USING THE SAME

CROSS-REFERENCE TO RELATED APPLICATION

The priority of Korean patent application number 10-2006-0137140, filed on Dec. 28, 2006, which is incorporated by reference in its entirety, is claimed.

BACKGROUND OF THE INVENTION

The invention relates to micro-lithography and, more particularly, to a mask with a focus measurement pattern and a method for measuring a focus value in an exposure process using the same.

When manufacturing an integrated circuit device or a semiconductor device, a micro-lithography process of transferring circuit patterns designed on a mask onto a wafer is performed. The micro-lithography process includes an exposure stage in which circuit patterns on a mask are transferred onto a wafer by using an exposure apparatus, and a stage performing a selective etching using an exposed resist pattern.

At this time, the accurate transfer of the circuit patterns oil the mask onto the wafer depends on an extent of focus change in the exposure stage. Due to various geometrical elements or optical elements, the focus value changes for wafer regions when transferring the patterns onto the wafer. The exposure stage is performed at the optimum focus value which is set through experiments, a priori, or simulations. However, the practical focus value may change from the optimum focus value for the wafer regions, which causes a deformed pattern transfer onto the wafer when compared to the exposure performance at the optimum focus value. In order to control the extent of focus change, a focus measurement is performed. In order to achieve the stable pattern transfer, the extent of focus change applied to the wafer and the focus margin (an allowable extent in the manufacturing process) are measured and checked.

In the process of transferring the circuit patterns of the mask onto the wafer, a focus measurement pattern, which is formed on a region (e.g., a scribe lane region) except for a chip region onto which the circuit patterns are transferred, is used for the focus measurement. When the focus measurement pattern provided on the mask is transferred onto the wafer in the exposure process, the extent of focus change is measured by measuring the extent of deformation occurring to the focus measurement pattern.

The focus measurement pattern is designed such that when the focus value changes, the deformation of the patterns transferred onto the wafer is caused. The change of the focus value happens when the focus of the incident light onto the surface of the wafer changes along a Z-axis direction, perpendicular to the surface of the wafer. Accordingly, the focus measurement pattern is configured such that the focus change along the Z-axis causes a shift of the patterns formed on the wafer. For example, the pattern formed by selectively etching the transparent mask substrate is used as the focus measurement pattern. Such a focus measurement pattern is disposed adjacent to an overlay measurement pattern including a light-shielding pattern of chromium (Cr).

A phase difference between transmitted light is generated between the surface of the mask substrate and the etched phase reversal pattern. Accordingly, the progressing direction of the light changes in a slanted direction at a predetermined angle from the incident direction, i.e., the vertical direction. The focus height changes in the Z-axis direction on the wafer, depending upon the slanted angle of the exposure light, and the transfer position of the measurement pattern on the wafer changes. The extent of focus change is quantitatively measured based on the extent of shift of the measurement pattern transferred onto the wafer in the XY-axis directions.

In the process of forming the focus measurement pattern, when etching the mask substrate for the phase reversal region, it is necessary that the etching is achieved very uniformly. If the uniformity of the etched pattern is relatively low, the extent of pattern shift on the wafer cannot reliably represent the degree of focus change. However, because it is so difficult to uniformly perform the etching on the mask substrate, there is considerable difficulty in the accurate focus measurement. The etched pattern on the mask for the phase reversal region is formed adjacent to the light-shielding pattern of chromium. Thus, an additional selective etching process is required after the formation of the light-shielding pattern of chromium. Also, attack or damage may occur on the light-shielding pattern of chromium or the surface of the mask substrate in the etching process, and it causes quality degradation of the mask.

BRIEF SUMMARY OF THE INVENTION

The invention provides a mask with a focus measurement pattern and a method for measuring a focus value in an exposure process using the same that are capable of improving measurement of a focus change.

Consistent with one aspect, an exemplary embodiment of the invention provides a mask for exposure comprising: an outer reference pattern which provides a position reference for focus measurement; and focus measurement patterns which are spaced from the outer reference pattern and form lines extending in two different directions.

The mask may preferably further comprise an inner reference pattern having a polygonal shape with at least two opposed sides. The focus measurement patterns preferably contact one of the two opposed sides of the inner reference pattern in a line shape.

The inner reference pattern preferably has a rectangular shape, at the focus measurement patterns preferably extend from two adjacent perpendicular sides of the inner reference pattern and preferably contact of the focus measurement patterns to two remaining sides of the inner reference pattern may preferably be excluded.

The mask may preferably further comprise an inner reference pattern which is formed by the focus measurement patterns extending in different directions and crossing in a polygonal lattice stricture. One of the focus measurement patterns preferably extends from the inner reference pattern in an outward direction, and the focus measurement of patterns do not extend in opposite directions.

The polygonal lattice may preferably be a rectangular lattice in which the focus measurement patterns cross perpendicularly.

The outer reference pattern may preferably be a rectangular frame pattern which is disposed apart from the rectangular lattice.

The focus measurement patterns preferably have a line width narrower than a width of the outer reference pattern, and are formed on a transparent mask substrate.

The line width of the focus measurement patterns may preferably be equal to a line width of a circuit pattern formed on the mask substrate to be transferred onto a wafer.

The focus measurement patterns may preferably have a line width that causes a line shortening phenomenon according to an extent of focus change when the focus measurement patterns are transferred onto a wafer in an exposure process.

Consistent with another aspect an exemplary embodiment of the invention provides a method for measuring a focus value in an exposure process, comprising: a) providing a mask including an outer reference pattern which provides a position reference for focus measurement and focus measurement patterns which are spaced from the outer reference pattern and form lines extending in two different directions; b) exposing a wafer and transferring the patterns onto the wafer by using the mask; c) measuring an extent of line shortening of the focus measurement patterns due to a focus change in the exposure process by detecting positions of the outer reference pattern and the focus measurement patterns transferred onto the wafer; and d) calculating an extent of focus change from the extent of line shortening of the focus measurement patterns.

The measuring step c) may preferably include: irradiating measurement light to the wafer onto which the patterns are transferred and acquiring peaks of first detected light with respect to the outer reference pattern; acquiring peaks of second detected light with respect to the inner reference pattern and the focus measurement patterns; measuring an extent of overlay between a first center of the peaks of the first detected light and a second center of the peaks of the second detected light; and calculating the extent of line shortening of the focus measurement patterns due to the extent of overlay.

As described above, the invention provides the mask with the focus measurement pattern and the method for measuring the focus value in the exposure process using the same that are capable of improving the measurement of the focus change.

According to the invention, the focus change caused in the exposure stage of the micro-lithography process is preferably measured by using the line shortening phenomenon according to the extent of focus change. When the focus value changes from a predetermined optimum focus in the exposure process, the line pattern extending longitudinally on the wafer becomes shorter than the originally designed length or the acquired length at the optimum focus condition. Such a line shortening is generated from the end of the line pattern, and the extent of line shortening changes according to the extent of defocus from the optimum focus. The extent of focus change is measured based upon the measurement of the line shortening.

According to the invention, since the line shortening phenomenon which is generated at the circuit patterns according to the focus change is used, it is possible to measure more directly the focus environment applied to the circuit patterns formed on the wafer. Also, the focus measurement patterns can be formed together in the process of patterning a layer deposited on the mask to form a mask pattern for the transfer of the circuit patterns. An additional process for forming the focus measurement patterns on the mask, e.g., a mask substrate etching, process for a phase reversal region, is not needed. Accordingly, since an additional process in manufacturing the mask is not added, the mask can be manufactured more easily.

DETAILED DESCRIPTION OF THE INVENTION

Preferred embodiments of the invention will now be described in detail with reference to the accompanying drawings.

Figure 1:
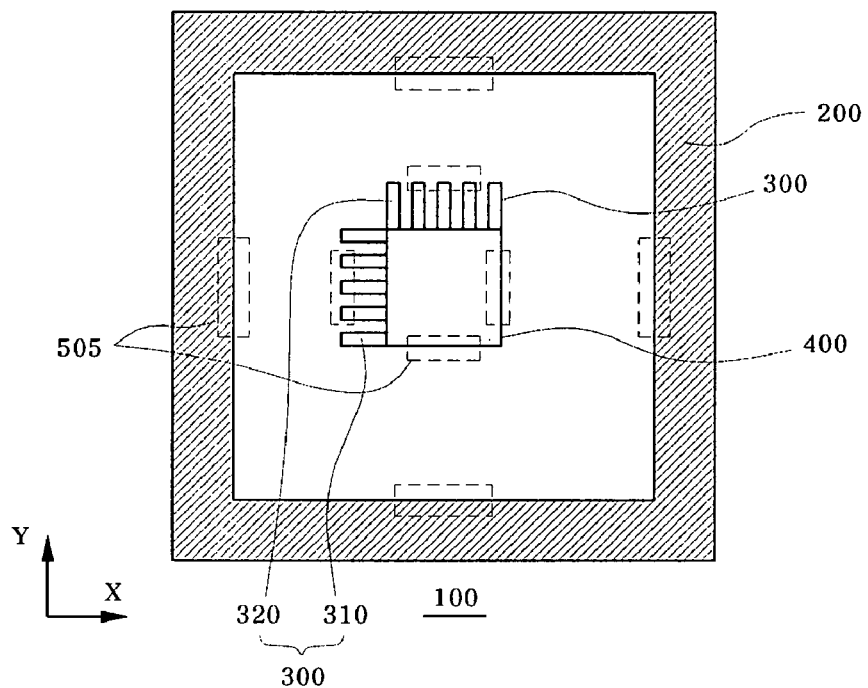
FIGS. 1 and 2 are schematic plan views illustrating a mask with a focus measurement pattern in accordance with the invention.
Figure 2:
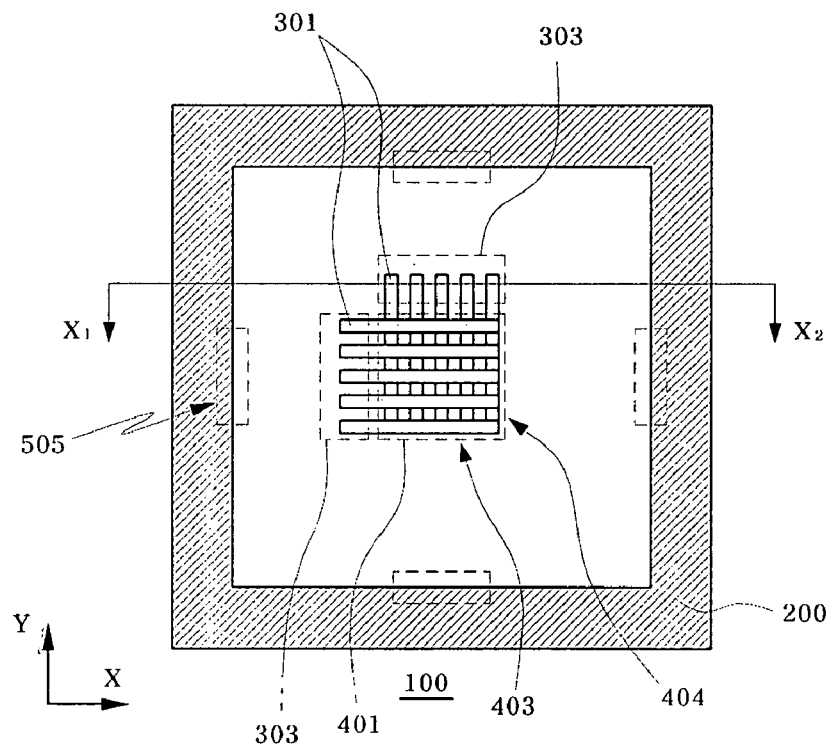
Figure 3:
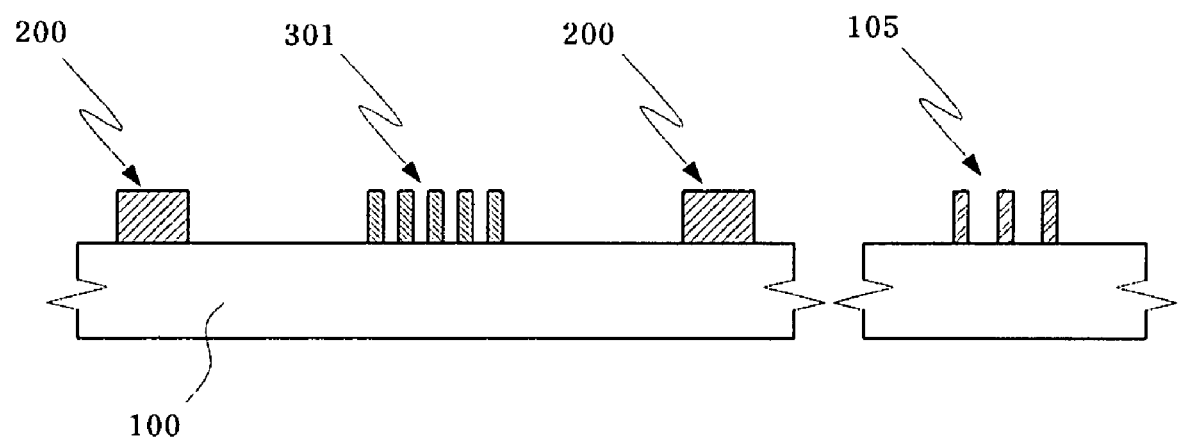
FIG. 3 is a schematic sectional view illustrating the mask with a focus measurement pattern in accordance with the invention.

FIGS. 1 and 2 are schematic plan views illustrating a mask with a focus measurement pattern in accordance with the invention, and FIG. 3 is a schematic sectional view illustrating the mask with a focus measurement pattern in accordance with the invention.

Referring to FIG. 1 the mask according to the invention is provided with a focus measurement pattern structure on a transparent mask substrate 100, which is transferred onto a wafer. The focus measurement pattern structure includes an outer reference pattern 200 which provides a position reference for the focus measurement, and line-shaped focus measurement patterns 300 which are disposed apart from the outer reference pattern 200 and extend in two different directions.

The outer reference pattern 200 may be configured as a polygonal (e.g., rectangular) frame pattern. The outer reference pattern 200 may be set to have a considerably wide line width so as to be relatively insensitive to a focus change in an exposure process. For instance, under the circumstance of an 1:4 reduction ratio in the exposure, the outer reference pattern 200 may be set to have a line width of several hundreds to several. When considering the reduction exposure, the line width of several hundreds may be formed on the wafer.

The outer reference pattern 200 having the above line width can be considerably unresponsive to the focus change in the exposure process using a krypton fluoride (KrF) light source or an argon fluoride (ArF) light source which is commonly applied to the exposure process. Since the outer reference pattern 200 has a line width considerably wider than a circuit pattern (refer to "105" in FIG. 3) constituting an integrated circuit device or a semiconductor device, such as a cell pattern or a peripheral pattern constituting a peripheral circuit, the outer reference pattern 200 reacts relatively insensitively to the exposure environment of defocus which is intentionally or unintentionally accompanied by the exposure process. Therefore, the substantial position shift of the transferred pattern is relatively limited. Also, because the outer reference pattern 200 is designed to be a rectangular frame pattern which is formed symmetrically with respect to XY-axis coordinates and although the pattern shift is caused, an extreme deformation of the pattern in any one direction is restricted. Accordingly, the outer reference pattern 200 is used as a reference in measuring the position shift of the focus measurement patterns 300 for the focus measurement.

The focus measurement patterns 300 are disposed at the interior of the outer reference pattern 200 while being spaced apart therefrom. As shown in FIG. 1, the focus measurement patterns 300 may be formed in a line shape, which protrudingly extend selectively from two adjacent perpendicular sides of an inner reference pattern 400 which is formed in a polygonal (preferably, rectangular) shape. The inner reference pattern 400 functions as an inner position reference by which the extent of deformation of the focus measurement patterns 300 are measured. Similarly to the outer reference pattern 200, the inner reference pattern 400 may be formed to have a relatively wide line width or area so as to be relatively sensitive to the focus change in the exposure process. Accordingly, the portion where the pattern deformation or shift happens corresponding to the focus change is the focus measurement patterns 300.

Considering convenience in measuring the position shift of the patterns, it is preferred that centers of the inner reference pattern 400 and an outline of the focus measurement patterns 300 are disposed at the same point as a center of the outer reference pattern 200. If the focus measurement patterns 300 are deformed, the centers of the deformed focus measurement patterns 300 and inner reference pattern 400 deviate from the center of the outer reference pattern 200. By measuring the extent of deviation of the centers of the patterns 200, 300 and 400, the extent of deformation of the focus measurement patterns 300 depending upon the focus change can be more conveniently measured.

As shown in FIG. 1, the focus measurement patterns 300 protrudingly extend in a line shape selectively from two adjacent sides of the inner reference pattern 400 which is formed in a solid rectangular shape. The respective line-shaped focus measurement patterns 300 are set to have a line width that causes line shortening according to the focus change in the exposure process. For instance, as shown in FIG. 3, the line width of each of the focus measurement patterns 300 may be set equal to the line width of the circuit pattern 105. This is for measuring the influence by the focus change caused at the circuit pattern 105, using the extent of focus change or pattern deformation measured by the focus measurement patterns 300.

Considering an 1:4 reduction ratio in the exposure on the mask substrate 100, each of the focus measurement patterns 300 may be set to have a line width of about 0.2 μm to about 0.5 μm. Also, each of the focus measurement patterns 300 may be set to have a length of about 10 μm. Also, it may be set that at least five focus measurement patterns 300 are disposed on one side of the inner reference pattern 400. The reason of disposing a plurality of focus measurement patterns 300 is to make peaks of detected light acquired in the subsequent measuring process represent the extent of average deformation of the focus measurement patterns 300.

Meanwhile, in order to measure the pattern shift in the N-axis direction and Y-axis direction on the XY-axis coordinates, the focus measurement patterns 300 may include X-axis measurement patterns 310 which extend in the X-axis direction and Y-axis measurement patterns 320 which extend in the Y-axis direction. It is preferred that the measurement patterns 310 and 320 do not extend in the opposite direction to the above extending directions. In other words, the focus measurement patterns 300 are asymmetrically arranged with respect to the N-axis direction or Y-axis direction.

If the focus measurement patterns 300 are symmetrically arranged, because the patterns are deformed in both the (+)X-axis direction and the (−)X-axis direction, a center position of the peaks of detected light in the measuring process may not shift. Accordingly, the focus measurement patterns 300 are arranged such that the patterns are deformed in only one direction so as to accompany the shift of the center position due to the pattern deformation. By measuring the extent of deviation of the center of the peaks of detected light for the overall focus measurement patterns 300 and inner reference pattern 400 from the center of the peaks of detected light for the outer reference pattern 200, the extent of deformation due to the line shortening of the focus measurement patterns 300 accompanied by the focus change can be measured. Such a measurement can be achieved by irradiating measurement light to inspection positions 505, for example, using an overlay measurement apparatus, and acquiring the peaks of the detected light.

As shown in FIG. 2, the inner reference pattern 400 and the focus measurement patterns 300 depicted in FIG. 1 may be modified to have a lattice structure. This is to consider the advantage that the patterns having a lattice structure can be more easily designed and achieved. Referring to FIG. 2, the focus measurement patterns 301 are extending arranged such that they cross in the X-axis direction and Y-axis direction. And, a portion 401 where the focus measurement patterns 301 form a polygonal (e.g., rectangular) lattice structure has a function substantially equivalent to the inner reference pattern 400 (refer to FIG. 1). At this time, protruding portions 303 of the focus measurement patterns 301, which protrude outwardly from the lattice portion 401, have a function substantially equivalent to the focus measurement patterns 300 (refer to FIG. 1). It is preferred that the focus measurement patterns 301 do not protrudingly extend outwardly from two other sides 403 and 404 of the lattice portion 401.

As shown in FIG. 3, the above-described focus measurement pattern structure depicted in FIGS. 1 and 2 may be constituted on the transparent mask substrate 100 together when the circuit pattern 105 is constituted. FIG. 3 shows a cross-sectional shape taken along line $X_1$-$X_2$ in FIG. 2. When the circuit pattern 105 is formed into a mask pattern including a light-shielding layer (e.g., a chromium (Cr) layer), the outer reference pattern 200, the inner reference pattern 400, and the focus measurement patterns 300 or 301 can be formed together. Accordingly, a separate mask manufacturing process (e.g., an additional etching process) for the focus measurement pattern structure can be excluded. As a result, damage or attack on the circuit pattern 105 due to the formation of the focus measurement pattern structure can be prevented. The circuit pattern 105 may be a pattern which is transferred onto the wafer to constitute a cell circuit or a peripheral circuit of an integrated circuit device or a semiconductor device.

Figure 4:
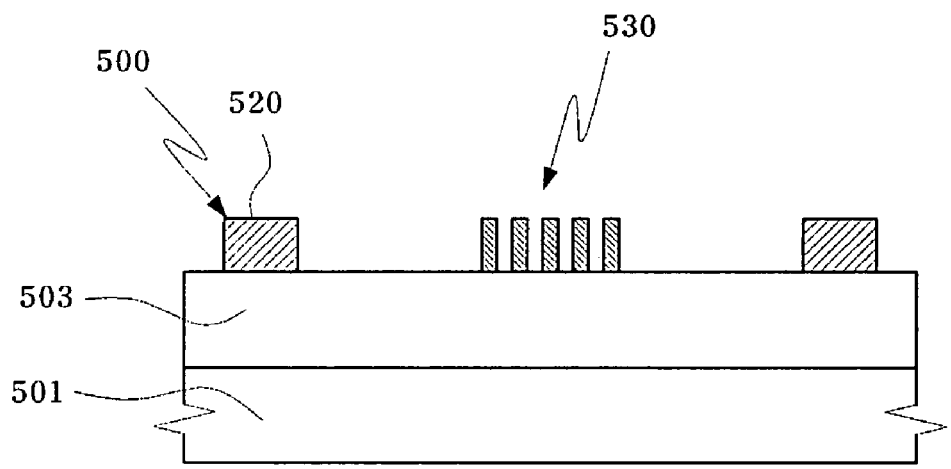
FIG. 4 is a schematic sectional view for explaining a method for measuring a focus value in an exposure process in accordance with the invention.
Figure 5:
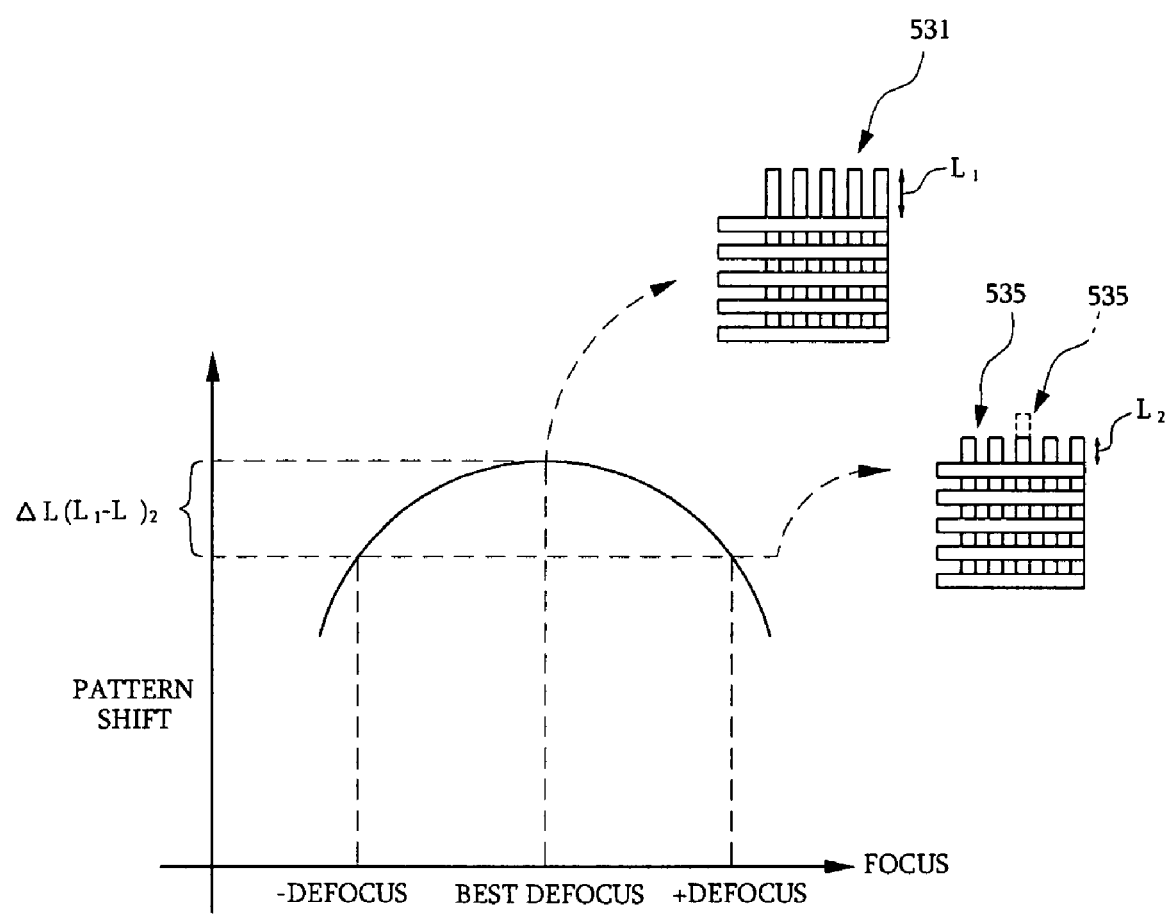
FIG. 5 is a view illustrating a result of measuring an extent of pattern shift due to a focus change in accordance with the invention.
Figure 6:
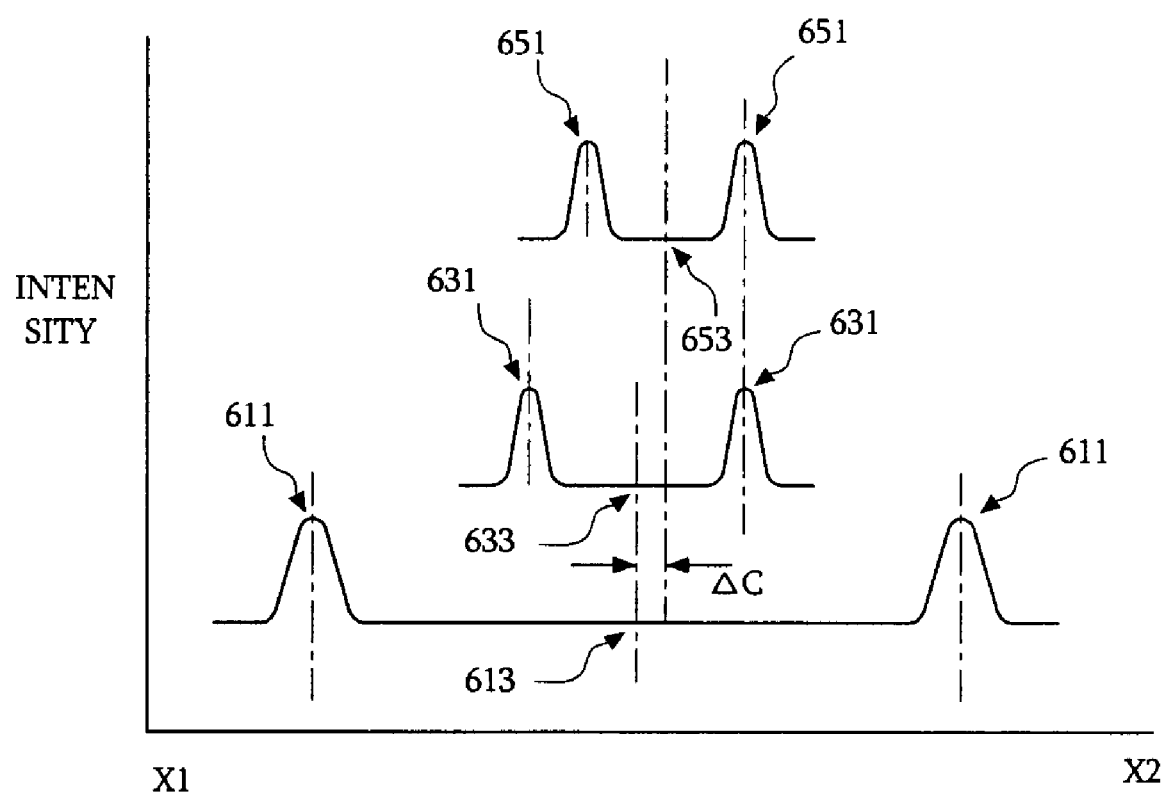
FIG. 6 is a view illustrating peaks of detected light in pleasuring the extent of pattern shift due to the focus change in accordance with the invention.

FIG. 4 is a schematic sectional view for explaining a method for measuring the focus value in the exposure process in accordance with the invention, FIG. 5 is a view illustrating a result of measuring an extent of pattern shift due to a focus chance in accordance with the invention, and FIG. 6 is a view illustrating peaks of detected light in measuring the extent of pattern shift due to the focus change in accordance with the present invention.

Referring to FIG. 4, the exposure process is applied to the wafer 501 using the mask with the focus measurement pattern structure depicted in FIG. 2. At this time, the exposure is applied to a resist layer 500 coated on an etching object layer 503 which is a material layer (e.g., a silicon dioxide layer or a conductive layer) introduced to constitute a circuit of a semiconductor device. Accordingly, the pattern transferred onto the wafer 501 is embodied in a pattern of the resist layer 500.

In FIG. 4, a first pattern 520 is generated by the outer reference pattern 200 (refer to FIG. 2) being transferred, and second patterns 530 are generated by the protruding portions 303 (refer to FIG. 2) of the focus measurement patterns 301 (refer to FIG. 2) (i.e., the portions corresponding to the focus measurement patterns 300 (refer to FIG. 1)) being transferred. The relative position shift or line shortening of the second patterns 530 to the first pattern 520 may be caused.

The position of the transferred second patterns 530 may shift according to the change of the focus which is preset for the exposure process. Because the focus measurement patterns 301 have a line width that reacts sensitively to the focus change in the exposure environment, pattern deformation (e.g., line shortening) is caused differently according to the extent of focus change. The line shortening may be restricted to the protruding portions of the focus measurement patterns 301. Accordingly, the relative position of the second patterns 530, which are generated by the focus measurement patterns 301 being transferred to the first pattern 520 may also shift. By measuring the relative position shift or line shortening by detecting the peak of detected light after the irradiation of measurement light, for example, using an overlay measurement apparatus, the extent of focus change can be quantitatively measured.

Referring to FIGS. 5 and 6, for example, when the focus measurement patterns depicted in FIG. 2 are transferred onto the wafer at the exposure condition having an optimum focus value, a length of a protruding portion of third patterns 531, which are generated by the focus measurement patterns 301 (refer to FIG. 2) being transferred, is measured by a value of $L_1$. Compared to this, when the focus measurement patterns are transferred at the exposure condition of defocus, a length of a protruding portion of fourth patterns 535, which are generated by the focus measurement patterns 301 (refer to FIG. 2) being transferred, is measured by a value of $L_2$. A difference $\Delta L$ between the lengths $L_1$ and $L_2$ ($\Delta L = L_1 - L_2$) corresponds to a degree of pattern shift. FIG. 5 is a graph showing the relation between the detected length difference $\Delta L$ and the focus change. Accordingly, if using the graph depicted in FIG. 5, the extent of focus change in the exposure process can be measured based upon the measurement of the length difference $\Delta L$ in the exposure process.

The measurement of the extent of focus change or length difference $\Delta L$ can be achieved by using a pattern position measurement apparatus such as an overlay measurement apparatus. If irradiating measurement light to the inspection positions 505 (refer to FIG. 2), peaks of the detected light with respect to the patterns 520 and 530 of the resist layer 500 (refer to FIG. 5) are acquired as shown in FIG. 6.

If the focus condition is optimal or ideal, a center 613 of first peaks 611 with respect to the first patterns 520, which are generated by the outer reference pattern 200 (refer to FIG. 2) being transferred, may be aligned with a center 633 of second peaks 631 with respect to the overall third patterns 531 (refer to FIG. 5), which are generated by the focus measurement patterns 301 being transferred. On the other hand, in the case of the defocus condition, a center 653 of third peaks 651 with respect to the overall fourth patterns 535 (refer to FIG. 5) deviates from the center 613 of the first peaks 611 according to the extent of line shortening of the fourth patterns 535.

The extent of deviation $\Delta C$ substantially corresponds to the length difference $\Delta L$ depicted in FIG. 5. Because the protruding portions 303 of the focus measurement patterns 301 are designed to extend in any one direction with respect to the lattice portion 403 (refer to FIG. 2) corresponding to the inner reference pattern 400 (refer to FIG. 1), the length difference $\Delta L$ is measured as a value equivalent to the degree of shift of the center 653 of the third peaks 651, i.e., the extent of center deviation $\Delta C$. Accordingly, the focus measurement according to the invention can be achieved by using an overlay measurement apparatus which detects whether centers of peaks of inner vernier and outer vernier patterns of an overlay vernier key structure are aligned with each other or not and measures an extent of deviation of the centers. As a result, separate equipment for the focus measurement is excluded.

As described above, the focus measurement pattern structure according the invention is configured to achieve the direct focus measurement using the line shortening phenomenon of the line patterns which is caused according to the focus change in the exposure process. Accordingly, as long as the focus measurement pattern structure is configured to use the line shortening phenomenon of the patterns, the focus measurement pattern structure depicted in FIGS. 1 and 2 may be modified in other types.

As apparent from the above description, according to the mask with the focus measurement pattern and the method for measuring the focus value in the exposure process using the same of the invention, the focus change on the wafer can be measured by measuring the extent of line shortening of the patterns transferred onto the wafer according to the focus change. Accordingly, the focus measurement pattern structure can be formed together on the same layer as the circuit pattern formed on the mask. Also, a separate mask substrate etching process for the focus measurement pattern structure can be excluded. Accordingly, the mask can be more easily manufactured.

The embodiments of the invention have been disclosed above for illustrative purposes. Those skilled in the art will appreciate that various modifications, additions and substitutions are possible, without departing from the scope and spirit of the invention as defined in the accompanying claims.

What is claimed is:

1. A mask for exposure comprising:
   an outer reference pattern that provides a position reference for focus measurement;
   an inner reference pattern having a rectangular shape; and
   focus measurement patterns that extend from two adjacent perpendicular sides of the inner reference pattern in a line shape and do not contact the two remaining sides of the inner reference pattern, and are spaced from the outer reference pattern.

2. A mask for exposure comprising:
   an outer reference pattern that provides a position reference for focus measurement;
   focus measurement patterns that are spaced from the outer reference pattern and form lines extending in two different directions; and
   an inner reference pattern that is formed by the focus measurement patterns extending in different directions and crossing in a polygonal lattice structure,
   wherein one of the focus measurement patterns extends from the inner reference pattern in an outward direction, and the focus measurement patterns do not extend in opposite directions.

3. The mask for exposure according to claim 2, wherein the polygonal lattice is a rectangular lattice in which the focus measurement patterns cross perpendicularly.

4. The mask for exposure according to claim 3, wherein the outer reference pattern is a rectangular frame pattern that is spaced from the rectangular lattice.

5. The mask for exposure according to claim 1, wherein the focus measurement patterns have a line width narrower than a width of the outer reference pattern, and are formed on a transparent mask substrate.

6. The mask for exposure according to claim 5, wherein the line width of the focus measurement patterns is equal to a line width of a circuit pattern formed on the mask substrate to be transferred onto a wafer.

7. The mask for exposure according to claim 1, wherein the focus measurement patterns have a line width that causes a line shortening phenomenon according to an extent of focus change when the focus measurement patterns are transferred onto a wafer in an exposure process.

8. A method for measuring a focus value in an exposure process, comprising:
providing a mask including an outer reference pattern that provides a position reference for focus measurement, an inner reference pattern having a rectangular shape; and focus measurement patterns that extend from two adjacent perpendicular sides of the inner reference pattern in a line shape and do not contact the two remaining sides of the inner reference pattern, and are spaced from the outer reference pattern;
exposing a wafer and transferring the patterns onto a wafer by using the mask;
measuring an extent of line shortening of the focus measurement patterns due to a focus change in the exposure process by detecting positions of the outer reference pattern and the focus measurement patterns transferred onto the wafer; and
calculating an extent of focus change from the extent of line shortening of the focus measurement patterns.

9. A method for measuring a focus value in an exposure process, comprising:
providing a mask including an outer reference pattern that provides a position reference for focus measurement, focus measurement patterns that are spaced from the outer reference pattern and form lines extending in two different directions, and an inner reference pattern that is formed by the focus measurement patterns extending in different directions and crossing a polygonal lattice structure,
wherein one of the focus measurement patterns extends from the inner reference pattern in an outward direction, the focus measurement patterns do not extend in opposite directions,
exposing a wafer and transferring the patterns onto a wafer by using the mask;
measuring an extent of line shortening of the focus measurement patterns due to a focus change in the exposure process by detecting positions of the outer reference pattern and the focus measurement patterns transferred onto the wafer; and
calculating an extent of focus change from the extent of line shortening of the focus measurement patterns.

10. The method according to claim 9, wherein the step of measuring an extent of line shortening includes:
irradiating measurement light to the wafer onto which the patterns are transferred and acquiring peaks of first detected light with respect to the outer reference pattern;
acquiring peaks of second detected light with respect to the inner reference pattern and the focus measurement patterns;
measuring an extent of overlay between a first center of the peaks of the first detected light and a second center of the peaks of the second detected light; and
calculating the extent of line shortening of the focus measurement patterns due to the extent of overlay.

* * * * *